(12) United States Patent
Bartley et al.

(10) Patent No.: US 9,612,988 B2
(45) Date of Patent: Apr. 4, 2017

(54) DONOR CORES TO IMPROVE INTEGRATED CIRCUIT YIELD

(71) Applicant: International Business Machines Corporation, Armonk, NY (US)

(72) Inventors: Gerald K. Bartley, Rochester, MN (US); Darryl J. Becker, Rochester, MN (US); Philip R. Germann, Oronoco, MN (US); William P. Hovis, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 912 days.

(21) Appl. No.: 13/948,805

(22) Filed: Jul. 23, 2013

(65) Prior Publication Data
US 2015/0032933 A1    Jan. 29, 2015

(51) Int. Cl.
| | |
|---|---|
| *G06F 17/50* | (2006.01) |
| *H01L 21/48* | (2006.01) |
| *H01L 25/04* | (2014.01) |
| *H01L 23/488* | (2006.01) |
| *G06F 13/40* | (2006.01) |

(52) U.S. Cl.
CPC ...... *G06F 13/4022* (2013.01); *H01L 21/4857* (2013.01); *H01L 21/485* (2013.01); *H01L 21/486* (2013.01); *H01L 23/488* (2013.01); *H01L 25/043* (2013.01); *Y02B 60/1228* (2013.01); *Y02B 60/1235* (2013.01)

(58) Field of Classification Search
CPC . H01L 21/4857; H01L 21/486; H01L 21/485; H01L 23/488; H01L 25/043
USPC .............................. 716/137; 438/4; 257/777
See application file for complete search history.

(56) References Cited

U.S. PATENT DOCUMENTS

| | | | | |
|---|---|---|---|---|
| 6,960,837 | B2 * | 11/2005 | Iadanza | ................. H01L 23/481 257/503 |
| 7,512,837 | B1 * | 3/2009 | Flemming | ........... G06F 11/0724 711/149 |
| 8,140,297 | B2 | 3/2012 | Bartley et al. | |
| 8,327,126 | B2 | 12/2012 | Bell, Jr. et al. | |

(Continued)

FOREIGN PATENT DOCUMENTS

| | | |
|---|---|---|
| JP | 201181883 Y | 1/2009 |
| JP | 2011138966 A1 | 11/2011 |

*Primary Examiner* — Stacy Whitmore
(74) *Attorney, Agent, or Firm* — Jay Wahlquist

(57) ABSTRACT

A device uses donor circuit blocks in a donor integrated circuit to replace defective circuit blocks in a recipient integrated circuit and create a functional integrated circuit. The recipient integrated circuit has a first number of cores, the first number including a recipient core, and the recipient core having a recipient circuit block, a switching element, and a recipient communication point, the first number of cores connected by a data bus. The recipient core has an intended function. The donor integrated circuit has a second number of cores, the second number smaller than the first number. The second number includes a donor core having a donor communication point electrically connected to a donor circuit block, the donor circuit block having the intended function. The recipient connection point is electrically connected to the donor connection point and the switching element switched to disable the recipient circuit block in the recipient core.

14 Claims, 4 Drawing Sheets

(56) References Cited

U.S. PATENT DOCUMENTS

| | | | | |
|---|---|---|---|---|
| 8,581,419 B2* | 11/2013 | Su | ............... | H01L 23/642 257/659 |
| 8,624,626 B2* | 1/2014 | Chi | ............... | H03K 19/1737 257/777 |
| 8,669,776 B2* | 3/2014 | Whetsel | ............... | G01R 31/31715 324/750.3 |
| 8,729,691 B2* | 5/2014 | Farrar | ............... | H01L 23/3121 257/687 |
| 8,736,068 B2* | 5/2014 | Bartley | ............... | H01L 25/0657 257/774 |
| 9,100,006 B2* | 8/2015 | Chi | ............... | H03K 19/1737 |
| 9,281,261 B2* | 3/2016 | Bartley | ............... | H01L 23/34 |
| 9,310,827 B2* | 4/2016 | Bartley | ............... | G06F 1/04 |
| 2006/0080631 A1* | 4/2006 | Koo | ............... | G06F 17/5045 326/41 |
| 2008/0235454 A1* | 9/2008 | Duron | ............... | G06F 11/1064 711/128 |
| 2009/0121736 A1* | 5/2009 | Jenkins | ............... | G01R 31/2884 324/754.23 |
| 2010/0295189 A1* | 11/2010 | Chou | ............... | H01L 23/525 257/777 |
| 2011/0084404 A1 | 4/2011 | Yoko et al. | | |
| 2011/0090004 A1* | 4/2011 | Schuetz | ............... | G11C 29/808 327/564 |
| 2011/0110065 A1* | 5/2011 | Foster, Sr. | ............... | H01L 25/0657 361/803 |
| 2011/0131391 A1* | 6/2011 | Barowski | ............... | G06F 15/7842 712/12 |
| 2012/0092943 A1 | 4/2012 | Nishioka | | |
| 2012/0096415 A1* | 4/2012 | Koo | ............... | G06F 17/5045 716/101 |
| 2012/0195136 A1 | 8/2012 | Yoko | | |
| 2012/0248600 A1 | 10/2012 | Shigezane et al. | | |
| 2012/0248629 A1* | 10/2012 | Knickerbocker | ............... | H01L 21/486 257/777 |
| 2012/0267791 A1 | 10/2012 | Lee et al. | | |
| 2013/0009324 A1* | 1/2013 | Bartley | ............... | G06F 17/5068 257/774 |
| 2013/0049804 A1* | 2/2013 | Whetsel | ............... | G01R 31/31715 326/56 |
| 2013/0120021 A1* | 5/2013 | Chi | ............... | H03K 19/1737 326/37 |
| 2013/0176763 A1* | 7/2013 | Ware | ............... | G11C 29/808 365/51 |
| 2013/0235644 A1* | 9/2013 | Chung | ............... | G11C 17/16 365/103 |
| 2013/0332774 A1* | 12/2013 | Sinanoglu | ............... | G06F 11/263 714/32 |
| 2014/0082453 A1* | 3/2014 | Sikdar | ............... | G11C 29/808 714/763 |
| 2014/0091834 A1* | 4/2014 | Chi | ............... | H03K 19/1737 326/37 |
| 2014/0108778 A1 | 4/2014 | Molloy et al. | | |
| 2014/0317389 A1 | 10/2014 | Wenisch et al. | | |
| 2014/0321186 A1* | 10/2014 | Ware | ............... | G11C 29/808 365/51 |
| 2015/0032933 A1* | 1/2015 | Bartley | ............... | G06F 13/4022 710/316 |
| 2015/0279773 A1* | 10/2015 | Fu | ............... | H01L 21/76898 257/621 |
| 2015/0357002 A1* | 12/2015 | Ware | ............... | G11C 29/808 365/51 |

\* cited by examiner

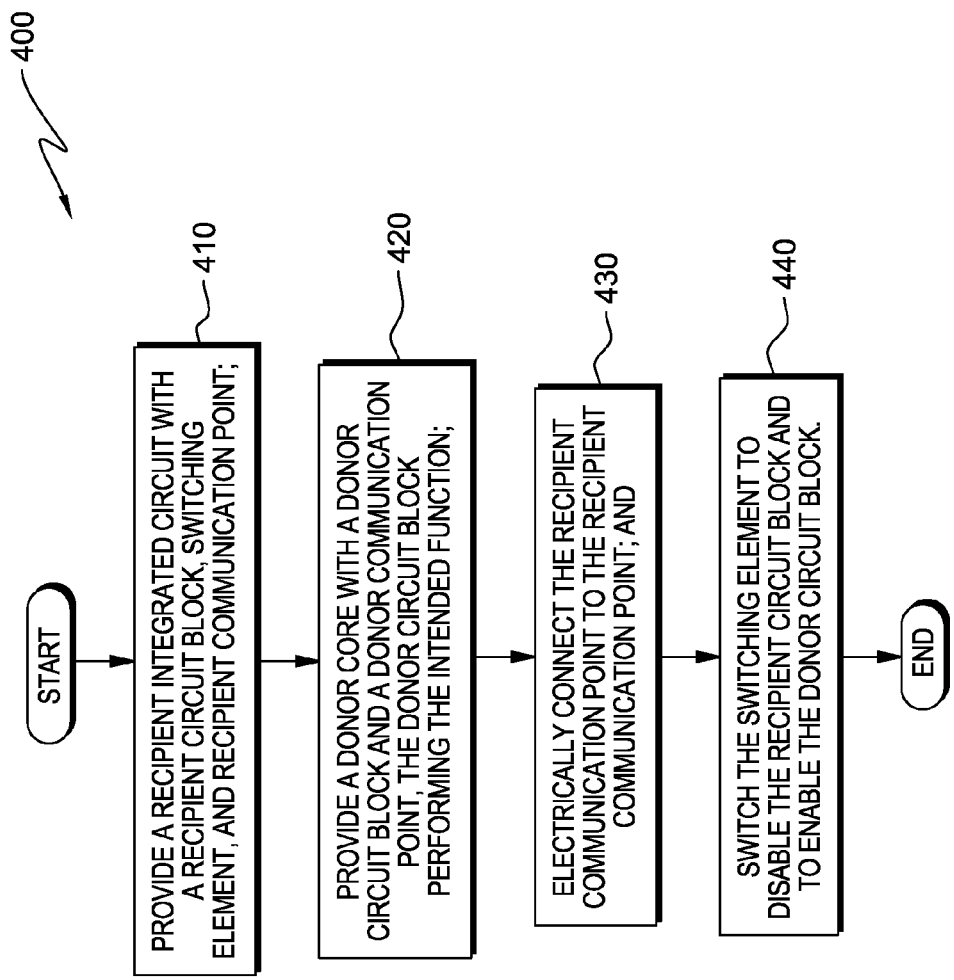

DONOR CORES TO IMPROVE INTEGRATED CIRCUIT YIELD

TECHNICAL FIELD

This disclosure relates generally to semiconductor chip manufacturing and more specifically to improving yields of functional integrated circuits.

BACKGROUND

Integrated circuits created by semiconductor manufacturing processes often contain defects, some of which may impact the function of the integrated circuit. Some defects may render parts of the integrated circuit unusable. Semiconductor manufacturers seek to improve the yield of manufacturing processes by bypassing defective portions of integrated circuits.

SUMMARY

Disclosed herein are embodiments of a semiconductor device. The semiconductor device includes a recipient integrated circuit electrically connected to a donor integrated circuit appended to the recipient integrated circuit. The recipient integrated circuit has a data bus and a first number of cores in the recipient integrated circuit. The data bus connects the first number of cores in the recipient integrated circuit to each other. The first number of cores contains a recipient core, a switching element, a recipient communication point, and a recipient circuit block, the recipient circuit block having an intended function in the recipient integrated circuit. The switching element is connected to the data bus, the recipient circuit block, and the recipient communication point. The donor integrated circuit has a second number of cores, the second number of cores being less than the first number of cores. The second number of cores contains a donor core having a donor circuit block connected to a donor communication point. The donor circuit block has the intended function of the recipient circuit block. Connecting the recipient communication point and the donor communication point creates a continuous electrical connection between the data bus and the donor circuit block.

Further disclosed herein is a method of creating embodiments of the disclosed invention. A manufacturer provides a recipient integrated circuit with a recipient circuit block, a switching element, and a recipient communication point. The recipient circuit block has an intended function in the recipient integrated circuit. The manufacturer further provides a donor core with a donor circuit block and a donor communication point, the donor circuit block also having the intended function of the recipient circuit block. The manufacturer connects the recipient communication point to the donor communication point and switches the switching element to disable the recipient circuit block and to enable the donor circuit block.

BRIEF DESCRIPTION OF THE SEVERAL VIEWS OF THE DRAWINGS

FIG. 4 shows a flow diagram of a method of creating embodiments of invention.

DETAILED DESCRIPTION

Figure 1:
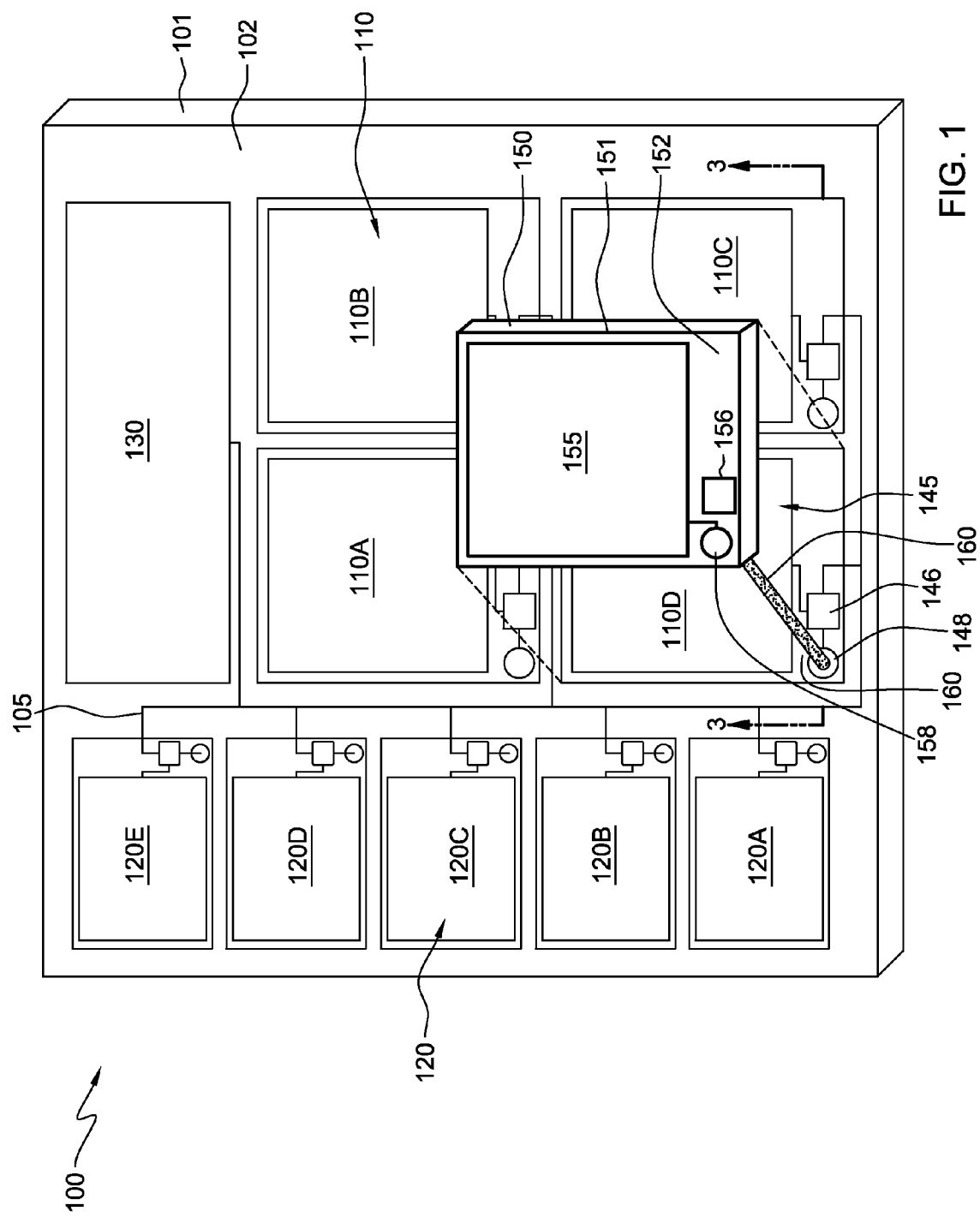
FIG. 1 shows an illustrative diagram of one embodiment of the invention where a donor integrated circuit is appended to a recipient integrated circuit.

Production efficiency is critical to the success of manufacturing processes because it strongly influences the profitability and cost of producing manufactured goods. As a manufacturing process becomes more efficient, the manufacturer is generally able to produce goods in less time or at lower cost than before efficiency gains occurred.

In semiconductor manufacturing, yield refers to the fraction of functional chips or integrated circuits produced by a manufacturing process. The product of a semiconductor manufacturing process may be referred to as either a chip, a die, or an integrated circuit. A chip or die is typically a part of a usually silicon wafer that undergoes a manufacturing process to build an integrated circuit on the surface of the wafer. A wafer is divided into pieces by a process called dicing.

An integrated circuit is a circuit where the parts of the circuit are inseparably associated with each other and electrically connected. Integrated circuits built on usually silicon wafers include, as part of the circuit, areas of the wafer surface that have been modified to have specific electrical properties. Other parts of the circuit are typically built atop this treated wafer surface as layers of materials are added to the wafer surface. Because these added-on components of the circuit (contacts, trenches, vias, conducting materials, insulating materials, liners, etc. . . . ) are inseparable from the wafer surface, the term integrated circuit sometimes also includes the chip or die that contains the integrated circuit.

A core is a region of an integrated circuit that performs an intended function in the greater integrated circuit. A core contains a circuit block that actually performs the intended function as well as circuitry that conducts data into and out of the circuit block. A core may also contain additional circuit elements that can optionally disable the circuit block. Many modern integrated circuits contain multiple cores of different types, including such types as central processing units (CPUs), graphical processing units (GPUs), memory management units (MMUs), memory controllers, input/output controllers, optical sensors, and other specialty digital and analog circuit components.

As semiconductor technology has advanced, the structural features of integrated circuits have become extremely small. Semiconductor gate structures with lateral measurements smaller than 30 nanometers are commonly produced in many manufacturing facilities and film thicknesses as small as a few Angstroms are not uncommon. While these small dimensions are not found throughout the semiconductor device, other parts of integrated circuits have scaled to smaller sizes to achieve minimum die sizes that will fit more chips on a wafer.

The structure and chemical composition of a circuit's structural elements dictate the circuit's function. If either the structure or chemical composition is sufficiently disrupted the integrated circuit will not function as intended and the circuit will need to be discarded or repaired. The small size of individual structural elements in an integrated circuit makes them very fragile and susceptible to damage that may disrupt the integrated circuit's function. Such damage may be localized or widespread, potentially rendering a circuit block, a core, or an entire integrated circuit nonfunctional.

Integrated circuit defects may occur via chemical contamination, processing errors, electrostatic discharge, or the introduction of particles into the circuit so as to disrupt the electrical characteristics of properly formed circuit structural elements or to disrupt the physical structure of the circuit itself, interfering with the circuit's proper electrical function. For example, chemical contamination may disrupt the electrical performance of a gate structure creating a short in the circuit. Alternatively, when the chemical composition of photoresist is altered, the resist will not develop or dissolve properly, causing disruption or destruction of the intended pattern on the silicon wafer. Electrostatic discharge during film deposition or etching can melt deposited metal, break insulating barriers, and scatter particles across the wafer surface that bridge conductive areas or block conductive lines. Processing errors may result in incomplete etching, leaving, for example, material at the bottom of via structures that blocks the intended conductive path through an insulating dielectric layer. Also, particulate contamination can block etches, fill and break conductive lines, and knock over delicate gate structures.

Manufacturers combat these and other types of defects by identifying and eliminating the sources of individual defects in order to increase total chip yield. Typically, this means identifying and eliminating sources of particulate contamination, although wafer processing steps are also frequently adjusted to address chemical contamination or processing errors. The sources of the largest particulate contaminants are typically the easiest to eliminate and the first ones selected for removal because large particles affect larger areas of the integrated circuit. Identifying and eliminating the sources of smaller, more widespread particles is typically a more difficult exercise than for large particles, but may nevertheless be undertaken if the smaller particles cause sufficient harm to the final integrated circuits. Chemical contamination and electrostatic discharge damage may be identified by special analytical methods before the manufacturing process can be changed. Manufacturers recognize that in some circumstances, despite their best efforts, in situ defect reduction cannot completely eliminate yield problems, requiring additional steps to improve yield.

One method of overcoming persistent defects in integrated circuits is to design redundancy into the overall integrated circuit by placing additional cores in the chip. When a manufacturing process is complete, the manufacturer can test the chips for function and partition them according to their defectivity or performance. Fully functional chips can be sold or distributed without further treatment, while chips that have defective cores are subject to an in situ repair process, where defective cores are disabled or bypassed and functional redundant cores are enabled to provide the intended number of cores in the final integrated circuit product. Alternatively, a sufficient number of defective and normal cores may be disabled in order to provide a lesser number of cores that will provide for smooth operation of the integrated circuit at a lower performance level than originally planned for the circuit. Redundant cores are an expensive solution method of overcoming core-damaging defects. Redundant cores require more wafer surface area per chip and decrease the number of chips that fit on a single wafer, forcing a manufacturer to process more wafers to achieve a target number of functional chips.

An alternative method of overcoming core-damaging defects is to perform an ex situ repair process on defective chips by stacking two same-type chips on top of each other and electrically connecting parts of the two integrated circuits together. Manufacturers sometimes use defective chips from a single manufacturing process to repair each other by isolating good cores in a supplemental chip, deactivating bad cores in a primary chip, and linking the supplemental chip's good cores into the primary chip integrated circuit. When ex situ repair is successful, the repaired primary chip can perform its intended function and increases overall manufacturing yield. Ex situ stacked chip repair lets manufacturers choose when to eliminate redundant cores from the design of integrated circuits and shrink the area needed for each integrated circuit to fit more chips on a wafer.

Stacked-chip repair is not without problems, however. Matching functional cores on a supplemental chip with nonfunctional cores on a primary chip can be quite complex when trying to optimize the use of defective chips to repair each other. There may be difficulty providing a supply of chips with supplemental chip functional cores in designated locations because many defects tend to be randomly distributed across a wafer's surface. Even when there are supplemental chips that have functional cores in appropriate locations, selecting the "best" fit of all available supplemental chips to a primary chip may be problematic. Finding a perfect complementary match between every supplemental and primary chip may prove to be impossible or, at least, time consuming. A brief description of how chip stacking might work follows.

A manufacturing process for an integrated circuit containing multiple copies of different types of cores may ultimately produce hundreds or thousands of chips. The population of chips may be individually tested to map out the locations of defective cores on individual chips. Some chips may have fully functional integrated circuits that can be diced, packaged, and transferred to end users. Other chips may have one or more defects in the integrated circuit that will render one or more cores nonfunctional. The manufacturer may choose to disable nonfunctional cores (and possibly one or more of the functional cores) to create functional integrated circuits, some with less capacity than the original integrated circuit design. Alternatively, the manufacturer may choose to repair the damaged chip with a supplemental chip from the population of damaged chips.

During a repair process, individual chip maps may be catalogued and compared, and primary chips with defective cores at particular sites may be paired with supplemental chips having functional cores at those same locations. The cores at the particular sites may be isolated from the integrated circuits in which they reside, the chips bonded together, and the functional cores electrically connected to the primary integrated circuit, effectively replacing the defective cores and creating a new integrated circuit that functions according to its original specifications.

Optimally assigning the defective chips into supplemental and primary chip groups and creating pairs of supplemental and primary chips may be quite difficult. A maximum-efficiency solution to the pairing process might strive to create exact complementary matches: e.g., a primary chip with a single nonfunctional core and a supplemental chip having only a single functional core at that same site on the supplemental chip, or a primary chip with two nonfunctional cores and a supplemental chip having only two functional cores at the same two positions.

However, not all manufacturing processes may have sufficient defects to supply enough supplemental cores with only one functional core. If, for example, a chip design contains eight cores, but only a maximum of three cores damaged by defects, many supplemental chips will contain functional cores that will be left unused after the repair process. A non-optimal repair process may have this type of inherent inefficiency or waste. As the level of defectivity in the manufacturing process increases, there will be less waste of functional cores in supplemental chips, but the complexity of matching defective chips together to achieve the optimal (i.e., no waste) pairings may become operationally complex. This complexity may manifest an unpredictable number of chips with functional cores in particular locations, although the typically-random distribution of defects across wafer surfaces will tend to lessen this as a significant factor. The complexity may also arise if a given manufacturing process has significant variation in the overall number and types of defects over time.

The complexity and inherent inefficiency discussed above stems from the nature of the supplemental chip. So long as the remediation process requires that whole chips with full-design integrated circuits be used as the source of supplemental cores, there will be waste of both functional supplemental cores and silicon that might have been used to produce additional chips. An alternative repair process might eliminate this waste to improve overall production efficiency and yield.

One implication of using donor cores rather than whole chips or complete integrated circuits is that the power consumption for a repaired chip with a single donor core may be less than for a repair performed by appending a whole chip to the recipient chip. A whole chip appended to a recipient chip may require significant power in order to drive a clock across the chip, or may suffer from additional parasitic power consumption in order to operate while replacing a recipient core in the recipient chip. By reducing the size of the integrated circuit appended to the recipient chip that performs the repair, a practitioner may significantly reduce the amount of power necessary to run the appended chip and achieve a significant reduction in total power consumption.

Embodiments of the invention disclosed herein accomplish a similar type of repair of integrated circuits as the stacked chip repair previously described but reduce the logistical complexity and waste. Embodiments disclosed herein may further be accomplished with less complex supplemental chips. Some embodiments of the present invention repair a recipient chip by appending less than a complete integrated circuit, such as a single donor core, rather than a complete (full design) integrated circuit, onto each nonfunctional core in the recipient chip. The nonfunctional cores in the recipient chip may then be disabled or bypassed to incorporate the donor core into the integrated circuit.

Embodiments of a system and method for repairing a semiconductor chip as described herein may require semiconductor IC logic design, simulation, test, layout, and manufacture. Processes, machines and/or mechanisms for processing design structures or devices to generate logically or otherwise functionally equivalent representations of the design structures and/or devices described above and shown in the figures may be utilized. Design structures processed and/or generated may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flows may vary. For example, a design flow for building a fully functional integrated circuit, having a complete integrated circuit design, may differ from a design flow for building a donor core containing a single donor circuit block with a single function, or alternatively a donor chip having multiple donor cores of the same function or having different functions. Additionally, a design flow for building an application specific IC (ASIC) may differ from a design flow for designing a standard component or from a design flow for instantiating the design into a programmable array, for example a programmable gate array (PGA) or a field programmable gate array (FPGA) offered by Altera® Inc. or Xilinx® Inc.

A design structure may be a logical simulation design structure generated and processed by a design process to produce a logically equivalent functional representation of a hardware device. A design structure may also or alternatively comprise data and/or program instructions that when processed by a design process generate a functional representation of the physical structure of a hardware device. Whether representing functional and/or structural design features, a design structure may be generated using electronic computer-aided design (ECAD) such as implemented by a core developer/designer. When encoded on a machine-readable data transmission, gate array, or storage medium, a design structure may be accessed and processed by one or more hardware and/or software modules within a design process to simulate or otherwise functionally represent an electronic component, circuit, electronic or logic module, apparatus, device, or system such as those shown in the figures. As such, a design structure may comprise files or other data structures including human and/or machine-readable source code, compiled structures, and computer-executable code structures that when processed by a design or simulation data processing system functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

A design process may employ and incorporate hardware and/or software modules for synthesizing, translating, or otherwise processing a design/simulation functional equivalent of the components, circuits, devices, or logic structures shown in the figures to generate a netlist which may contain design structures. The netlist may comprise, for example, compiled or otherwise processed data structures representing a list of wires, discrete components, logic gates, control circuits, I/O devices, models, etc. that describes the connections to other elements and circuits in an integrated circuit design. The netlist may be synthesized using an iterative process in which the netlist is resynthesized one or more times depending on design specifications and parameters for the device. As with other design structure types described herein, the netlist may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design processes may include hardware and software modules for processing a variety of input data structure types including a netlist. Such data structure types may reside, for example, within library elements and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications, characterization data, verification data, design rules, and test data files which may include input test patterns, output test results, and other testing information. The design process may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in the design process without deviating from the scope and spirit of the embodiments disclosed herein. The design process may also include modules for performing standard circuit design processes such as timing analysis, verification, design rule checking, place and route operations, etc.

The design process may employ and incorporate logic and physical design tools such as HDL compilers and simulation model build tools to process a design structure together with some or all of the depicted supporting data structures along with any additional mechanical design or data (if applicable), to generate a second design structure. The design structure may reside on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). A design structure may comprise one or more files, data structures, or other computer-encoded data or instructions that reside on transmission or data storage media and that when processed by an ECAD system generate a logically or otherwise functionally equivalent form of one or more of the embodiments of the invention shown in the figures. In some embodiments, a design structure may comprise a compiled, executable HDL simulation model that functionally simulates the devices described herein.

A design structure may also employ a data format used for the exchange of layout data of integrated circuits and/or symbolic data format (e.g. information stored in a GDSII (GDS2), GL1, OASIS, map files, or any other suitable format for storing such design data structures). A design structure may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein. A design structure may then proceed to a stage where, for example, the design structure: proceeds to tape-out, is released to manufacturing, is released to a mask house, is sent to another design house, is sent back to the customer, etc.

FIG. 1 shows an exploded schematic diagram 100 of one possible embodiment of the present invention. FIG. 1 shows a recipient chip 101 containing a recipient integrated circuit 102. The recipient integrated circuit 102 includes a data bus 105, a first type of core 110, a second type of core 120, and a third type of core 130. The data bus 105 electrically connects individual cores to each other for data sharing. Cores 110A, 110B, 110C and 110D are all the first type of core 110 in the recipient integrated circuit 102. Elements 120A, 120B, 120C, 120D, and 120E are all the second type of core 120. In this embodiment of the invention, core 120E is broken and does not function. A broken core may be disabled or deactivated in order for the recipient integrated circuit 102 to function correctly as is common for integrated circuits designed with redundant cores.

Core 110D is also broken and does not perform an intended function for the first type of core 110. Core 110D may be designated for repair by appending a donor chip 150 having a donor core 152 to the recipient chip 101. A donor chip may have a single donor core, or a plurality of donor cores of a single type, or a plurality of donor cores, the plurality having multiple types of cores. Donor chips may not contain the full integrated circuit design found in the recipient integrated circuit 102. Some further embodiments of the invention may even append multiple donor cores in multiple donor chips to the recipient integrated circuit 102 in order to perform the repair process. Broken core 110D contains a recipient circuit block 145, a switching element 146, and a recipient communication point 148. The switching element 146 is electrically connected to the data bus 105. The switching element is also electrically connected to the recipient circuit block 145 and the recipient communication point 148. Broken core 110D may also be referred to as a recipient core, indicating that it may be replaced or bypassed by a repair process.

FIG. 1, further shows a second chip 150 containing a donor integrated circuit 151, the donor integrated circuit 151 having a donor core 152. The donor core 152 contains a donor circuit block 155, a donor switching element 156 and a donor communication point 158. The donor integrated circuit 151 may contain other structural elements commonly found in an integrated circuit, and may also contain multiple donor cores 152. The donor integrated circuit may also contain a donor data bus to enable communication between multiple donor circuit blocks 155. The switching element 146 may be one of numerous types of structures that can control data routing within an integrated circuit, such as electronic fuses, EPROM, EEPROM, flash PROM, circuit elements that perform presence detection (the electronic identification of the presence or absence of a donor core 152 through one or more of the electrical connections), and so forth, as well as latches that drive these items commonly or separately (set through any number of means, firmware, software, etc.).

In this embodiment the donor communication point 158 is electrically connected to the donor circuit block 155 and the donor switching element 156 is isolated from both the donor circuit block 155 and the donor communication point 158. In some embodiments, the donor switching element 156 may be electrically connected to the donor communication point 158 and the donor circuit block 155 and merely act as a pass-through element, not transforming or redirecting the signals between the donor circuit block 155 and the donor communication point 158. The presence or absence of a switching element in a donor core may effect the manufacturing process used to create the donor core and may make the donor core manufacturing process deviate from a well characterized manufacturing process used to make the recipient cores in recipient chips. It may be advantageous for a manufacturer to produce donor cores in batches in order to take advantage of efficiencies of scale that accompany large-scale manufacturing processes. Alternatively, individual donor cores may be located in spaces between full-design integrated circuits or on the periphery of a normal manufacturing wafer to take advantage of space that might not produce a full integrated circuit.

The second chip 150 may be located atop broken core 110D, and a chip connection element 160 connecting the recipient communication point 148 to the donor communication point 158 may be created between them. The chip connection element 160 may be created by wirebonding, as when the recipient communication point 148 and the donor communication point 158 are oriented in the same direction after the second chip is appended to the first chip 101 and they are not directly atop each other. The chip connection element 160 may also be formed with a solder bump, as when the recipient communication point 148 and the donor communication point 158 face each other after the second chip 150 is placed atop the first chip 101 and a solder bump is adhered to the communication points by heating. When the switching element 146 in the recipient core 140 is appropriately adjusted, the recipient circuit block 145 is electrically isolated from the recipient integrated circuit 102 and the donor circuit block 155 becomes part of the recipient integrated circuit 102.

Figure 2:
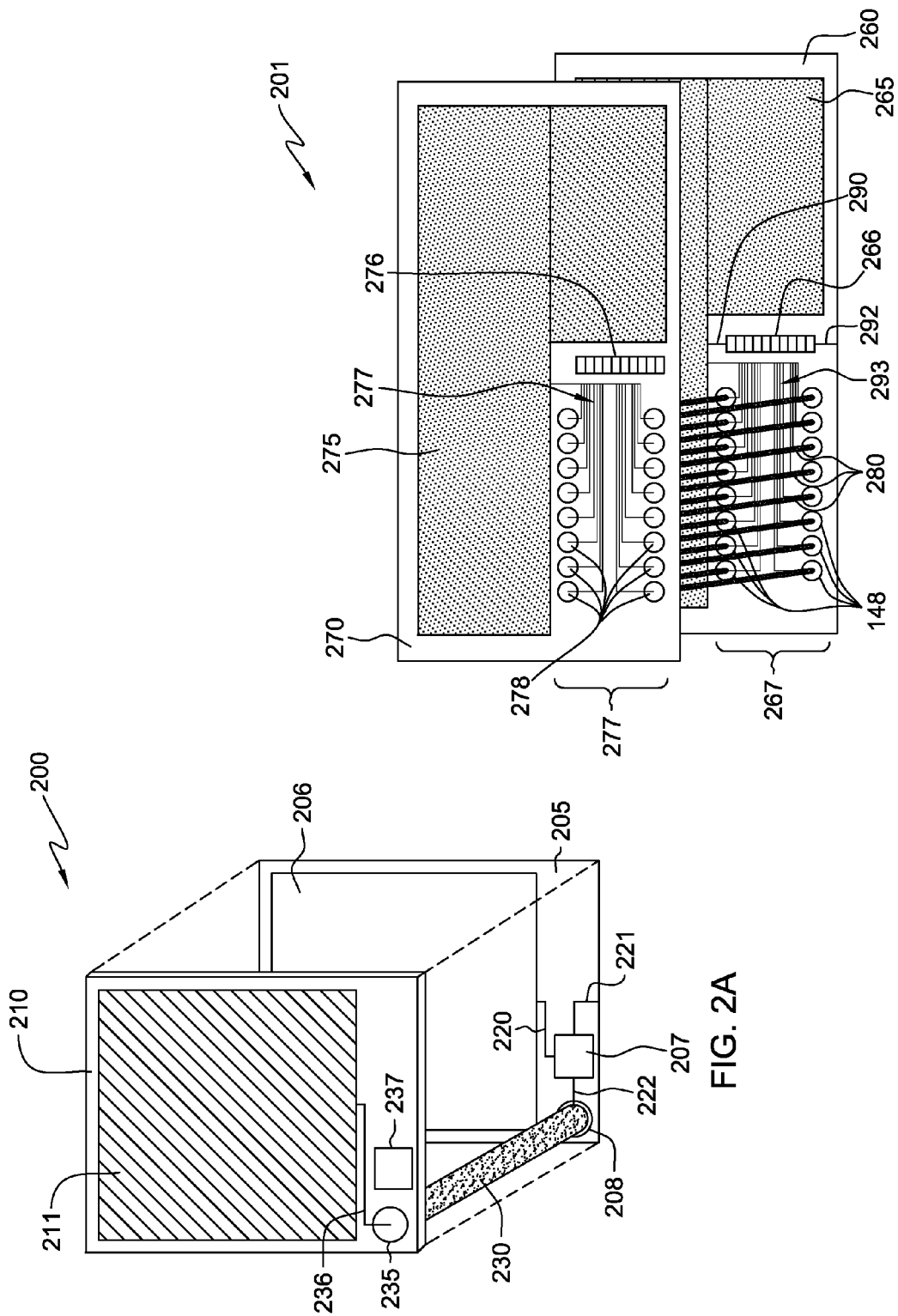
FIG. 2A shows an illustrative diagram of one embodiment of the invention where a donor circuit block in a donor integrated circuit is appended to a recipient core in a recipient integrated circuit.
FIG. 2B shows an illustrative diagram of one embodiment of the invention where a donor integrated circuit having multiple donor communication points is appended to a recipient core.

FIG. 2A shows a diagram 200 of one possible embodiment of the invention, where a recipient core 205 containing a recipient circuit block 206, a switching element 207, and recipient communication point 208, is electrically connected to a donor core 210 having a donor circuit block 211. A first electrical communication element 220 connects the recipient circuit block 206 to the switching element 207. A second electrical communication element 221 connects the switching element 207 to a data bus outside the recipient core 205. A third electrical communication element 222 connects the switching element 207 to the recipient communication point 208. A chip connection element 230 extends from the recipient communication point 208 to a donor communication point 235 located in the donor core 210. The donor core 210 also contains a donor switching element 237. The donor circuit block 211 is electrically connected to the donor communication point 235 by a fourth electrical communication element 236. The donor switching element 237 is isolated from the donor circuit block 211 and the donor communication point 235.

The chip connection element 230 may be created by means of soldering, as when two chips are electrically connected by a solder bump that adheres to metallic pad areas within the recipient communication point 208 and the donor communication point 235 in the recipient core 205 and the donor core 210, respectively. Alternatively, the chip connection element may be created by wirebonding if the connection points are not directly adjacent to each other once the chips are placed together, or if the metallic pads on the two chips are on the top sides of both the donor and recipient cores.

FIG. 2B shows a diagram 201 of an alternative embodiment of the invention, wherein a donor core 270 is appended to a recipient core 260. The recipient core 260 contains a recipient circuit block 265, a switching element 266 and a recipient communication element 267, the recipient communication element 267 having multiple recipient communication points 268. The donor core 270 contains a donor circuit block 275, a donor switching element 276 and a donor communication element 277, the donor communication element 277 having a plurality of donor communication points 278. The donor communication element 277 connects to the recipient communication element 267 with a chip connection element 280. The chip connection element may consist of a series of individual solder bumps or an array of wirebond connections that link individual donor connection points 278 to individual recipient communication points 268.

Figure 3:
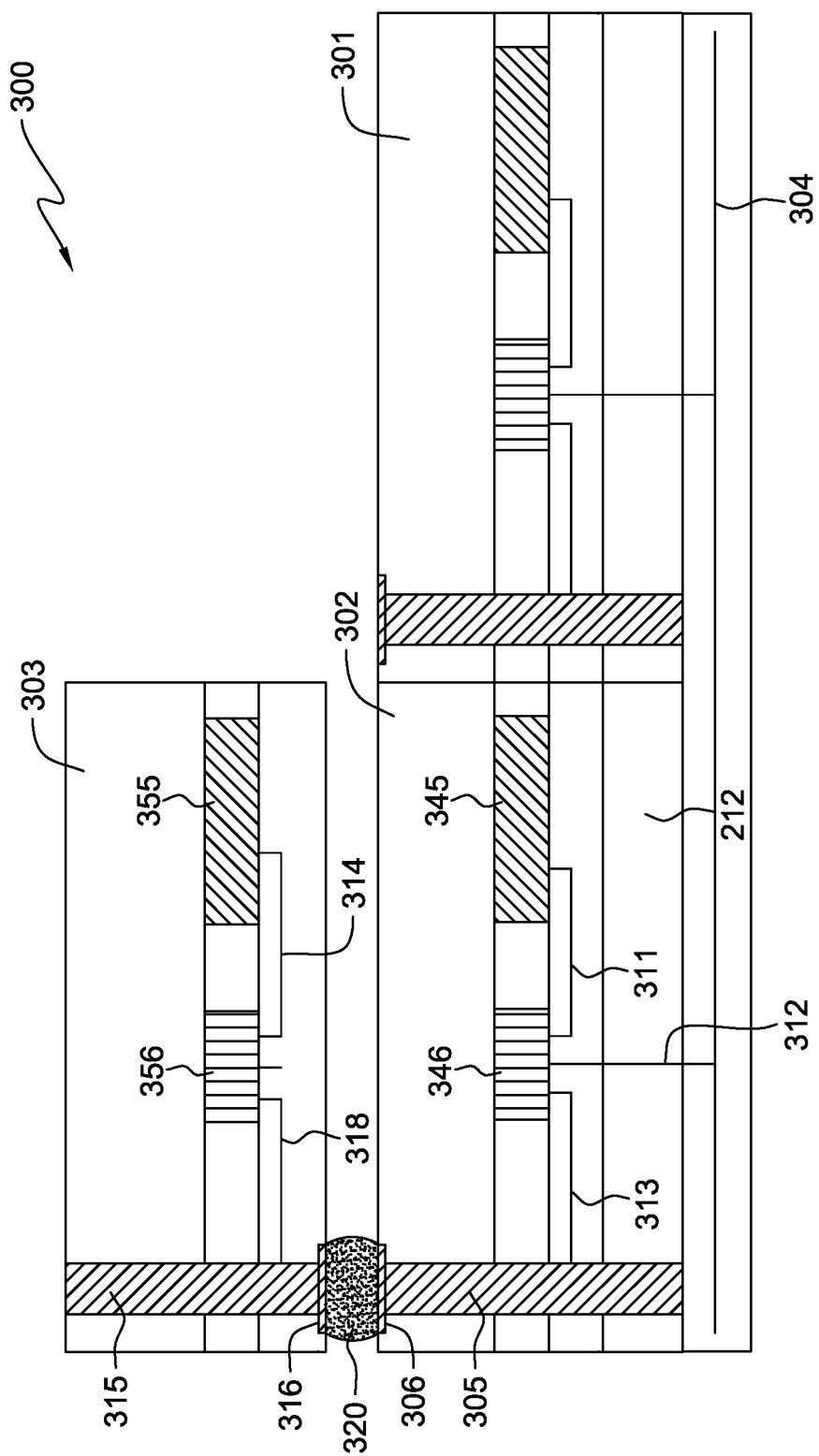
FIG. 3 shows an illustrative diagram of the invention, a sectional view of part of a donor integrated circuit appended to a recipient integrated circuit.

FIG. 3 shows a sectional view of one embodiment of the present invention, portraying a first core 301, a recipient core 302, and a donor core 303 atop the recipient core 302. The first core 301 and the donor core perform an intended function, but the recipient core 302 does not perform the intended function, perhaps because of a manufacturing defect. The recipient chip contains a data bus 304 that carries information between cores. The recipient core 302 contains a recipient through-silicon via 305 that terminates in a recipient pad 306. The data bus 304 is electrically connected to the switching element 346 by a first electrical connection element 312. The switching element 346 is electrically connected to a recipient circuit block 345 by a second electrical connection element 311. The switching element is further connected to the recipient through-silicon via 305 via a third electrical connection element 313. Through silicon vias for power may also be present in the donor core to activate a donor circuit 355 in the donor core 303. There may be a single switching element regulates signal routing from the data bus 304 to the donor core 303. There may further be other switching elements that control whether power is supplied to the donor core 303 and whether power is cut off from the recipient core 302. In some embodiments, depending on the nature of the switching element, there may be an individual switching element for each communication TSV or power TSV.

The donor core 303 contains a donor circuit block 355, a donor switching element 356 and a donor through-silicon via 315, the donor through-silicon via 315 terminating in a donor pad 316. The donor circuit block 355 electrically connects to the donor switching element 356 via a fourth electrical connection element 314, and the donor switching element 356 further connects to the donor through-silicon via 315 via a fifth electrical connection element 318. The recipient pad 306 and the donor pad 316 are electrically connected by a chip connection element 320 that may be formed by wirebonding or by formation of a solder bump that adheres to the recipient and donor pads to create a continuous electrical pathway between the data bus 304 and the donor circuit block 355.

FIG. 4 shows a flow chart describing an example method 400 of creating an embodiment of the present invention. In the first step 410, one provides a recipient integrated circuit with a recipient circuit block, a switching element and a first communication point. The recipient circuit has an intended function. In the second step 420, one provides a donor core with a second circuit block and a second communication point, where the second circuit block performs the same function as the recipient circuit block. In the third step 430, one will electrically connect the first communication point to the second communication point. Typically this electrical connection step will occur after the donor core is placed atop the recipient integrated circuit and physically adhered to the recipient integrated circuit. In the final step 440, the switching element in the recipient integrated circuit is switched to disable or to bypass the first circuit block and to enable the donor circuit block.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments herein.

What is claimed is:

1. A device comprising:
a recipient integrated circuit having a data bus and a first number of cores, the first number of cores including a recipient core, the recipient core having a switching element, a recipient communication point, and a recipient circuit block, the recipient circuit block having an intended function, the switching element connected to the data bus, the recipient circuit block, and the recipient communication point; and
a donor integrated circuit having a second number of cores, the second number less than the first number, the second number of cores including a donor core, the donor core having a donor circuit block connected to a donor communication point, the donor circuit block having the intended function, the donor communication point being electrically connected to the recipient communication point;
wherein the first number of cores includes a second recipient core, the second recipient core having a second switching element, a second recipient communication point, and a second recipient circuit block, the second recipient circuit block having a second intended function, the second switching element connected to the data bus, the second recipient circuit block, and the second recipient communication point,
the device further comprising: a second donor integrated circuit having a third number of cores, the third number less than the first number, the third number of cores including a second donor core, the second donor core having a second donor circuit block connected to a second donor communication point, the second donor circuit block having the second intended function, the second donor communication point being electrically connected to the second recipient communication point.

2. The device of claim 1, wherein the recipient core is selected from the group consisting of a logic circuit element, a graphical processing circuit element, an input/output circuit element, and a memory circuit element.

3. The device of claim 1, wherein the second number is equal to one.

4. The device of claim 1, wherein the second number is equal to one, and wherein the third number is equal to one.

5. The device of claim 1, wherein a recipient communication element connects the switching element and the recipient communication point, the recipient communication element including at least one through-silicon via.

6. The device of claim 1, wherein a donor communication element connects the donor circuit block and the donor communication point, the donor communication element including at least one through-silicon via.

7. The device of claim 1, wherein a chip connection element connects the recipient communication point and the donor communication point, the chip connection element created by at least one of wirebonding and soldering.

8. A method of appending a donor integrated circuit to a recipient integrated circuit, the method comprising:
providing the recipient integrated circuit having a data bus and a first number of cores, the first number of cores including a recipient core, the recipient core having a switching element, a recipient communication point, and a recipient circuit block, the recipient circuit block having an intended function, the switching element connected to the data bus, the recipient circuit block, and the recipient communication point;
providing the donor integrated circuit having a second number of cores, the second number less than the first number, the second number of cores including a donor core, the donor core having a donor circuit block electrically connected to a donor communication point, the donor circuit block having the intended function;
providing a second recipient core, the second recipient core having a second switching element, a second recipient communication point, and a second recipient circuit block, the second recipient circuit block having a second intended function, the second switching element connected to the data bus, the second recipient circuit block, and the second recipient communication point;
providing a second donor integrated circuit having a third number of cores, the third number less than the first number, the third number of cores including a second donor core, the second donor core having a second donor circuit block connected to a second donor communication point, the second donor circuit block having the second intended function;
electrically connecting the recipient communication point to the donor communication point;
electrically connecting the second recipient communication point to the second donor communication point;
switching the switching element to disable the recipient circuit block and enable the donor circuit block; and
switching the second switching element to disable the second recipient circuit block and enable the second donor circuit block.

9. The method of claim 8, wherein the recipient communication point is electrically connected to the donor communication point by at least one of soldering and wirebonding.

10. The method of claim 8, wherein the recipient core is selected from the group consisting of a logic circuit element, a graphical processing circuit element, an input/output circuit element, and a memory circuit element.

11. The method of claim 8, wherein the second number is equal to one.

12. The method of claim 8, wherein the recipient communication element connects the switching element and the recipient communication point, the recipient communication element including at least one through-silicon via.

13. The method of claim 8, wherein a donor communication element connects the donor circuit block and the donor communication point, the donor communication element including at least one through-silicon via.

14. The method of claim 8, wherein a chip connection element connects the recipient communication point and the donor communication point, the chip connection element created by at least one of wirebonding and soldering.

* * * * *